United States Patent
Yang et al.

(10) Patent No.: US 8,766,703 B1
(45) Date of Patent: Jul. 1, 2014

(54) METHOD AND APPARATUS FOR SENSING ON-CHIP CHARACTERISTICS

(71) Applicants: Jianan Yang, Austin, TX (US); James D. Burnett, Austin, TX (US); Mark W. Jetton, Austin, TX (US); Thomas W. Liston, Austin, TX (US)

(72) Inventors: Jianan Yang, Austin, TX (US); James D. Burnett, Austin, TX (US); Mark W. Jetton, Austin, TX (US); Thomas W. Liston, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/835,690

(22) Filed: Mar. 15, 2013

(51) Int. Cl.
*H01L 35/00* (2006.01)
*G05F 1/567* (2006.01)

(52) U.S. Cl.
CPC ....................................... *G05F 1/567* (2013.01)
USPC .......................................... 327/509; 327/512

(58) Field of Classification Search
CPC ....................................................... G01K 7/01
USPC ......................................... 327/509, 512, 513
See application file for complete search history.

(56) References Cited

U.S. PATENT DOCUMENTS

| | | | | |
|---|---|---|---|---|
| 7,741,925 B2 * | 6/2010 | Yoshikawa | ..................... | 331/176 |
| 7,977,999 B2 * | 7/2011 | Igarashi et al. | ............... | 327/512 |

OTHER PUBLICATIONS

Chen Zhao, et al., Linear Vt-based Temperature Sensors with Low Process Sensitivity and Improved Power Supply Headroom, IEEE, 2011, 2553-2556.

Yu-Wei Yang and Katherine Li, "Temperature-Aware Dynamic Frequency and Voltage Scaling for Reliability and Yield Enhancement", Design Automation Conference, 2009 ASP-DAC 2009, Jan. 19-22, 2009, pp. 49-54, Asia and South Pacific.

* cited by examiner

*Primary Examiner* — Jeffrey Zweizig
(74) *Attorney, Agent, or Firm* — The Mason Group Patent Specialists LLC; Valerie M. Davis

(57) ABSTRACT

A sensor circuit performs a method for sensing on-chip characteristics. The method includes generating a first voltage using a drive current through a first set of transistors that are operating in saturation mode and generating a second voltage using subthreshold leakage current from a second set of transistors that are in subthreshold mode. The method further includes comparing the second voltage to the first voltage to sense an on-chip characteristic. The sensed on-chip characteristic can be temperature and/or gate length variation.

20 Claims, 10 Drawing Sheets

800

US 8,766,703 B1

METHOD AND APPARATUS FOR SENSING ON-CHIP CHARACTERISTICS

FIELD

The present disclosure relates generally to integrated circuits and more specifically to a method and apparatus for sensing on-chip characteristics.

BACKGROUND

Advancements in integrated circuit (IC) technology, such as in very-large-scale integration (VLSI), have lead to a tremendous increase in device density and circuit speed. As a result, the high power consumption and power density become important design issues because high power density raises temperature and may cause overheating. High working temperature causes degradation in circuit performance that may lead to incorrect computation; and, in the worst case, it may permanently damage the chip. Therefore, a mechanism that can dynamically change power consumption so as to avoid overheating is very important to improve system reliability and yield. A key to such a mechanism is a reliable means of temperature sensing to detect areas on the chip that are or may be overheating.

In addition, with the building blocks of modern ICs, e.g., metal-oxide semiconductor field effect transistors (MOSFETs), becoming smaller, the number of atoms in the silicon that produce many of the transistors' properties is becoming fewer, with the result that control of dopant numbers and placement is more erratic. During chip manufacturing, random process variations affect the transistors' characteristics including, but not limited to, all transistor dimensions, such as gate length and width, junction depths, oxide thickness, etc. It is, therefore, also advantageous to monitor other on-chip characteristics that can impact IC performance such as variations in the transistors' characteristics resulting from the IC manufacturing process.

BRIEF DESCRIPTION OF THE DRAWINGS

The accompanying figures, where like reference numerals refer to identical or functionally similar elements throughout the separate views, together with the detailed description below, are incorporated in and form part of the specification, and serve to further illustrate embodiments of concepts that include the claimed invention, and explain various principles and advantages of those embodiments.

Figure 1:
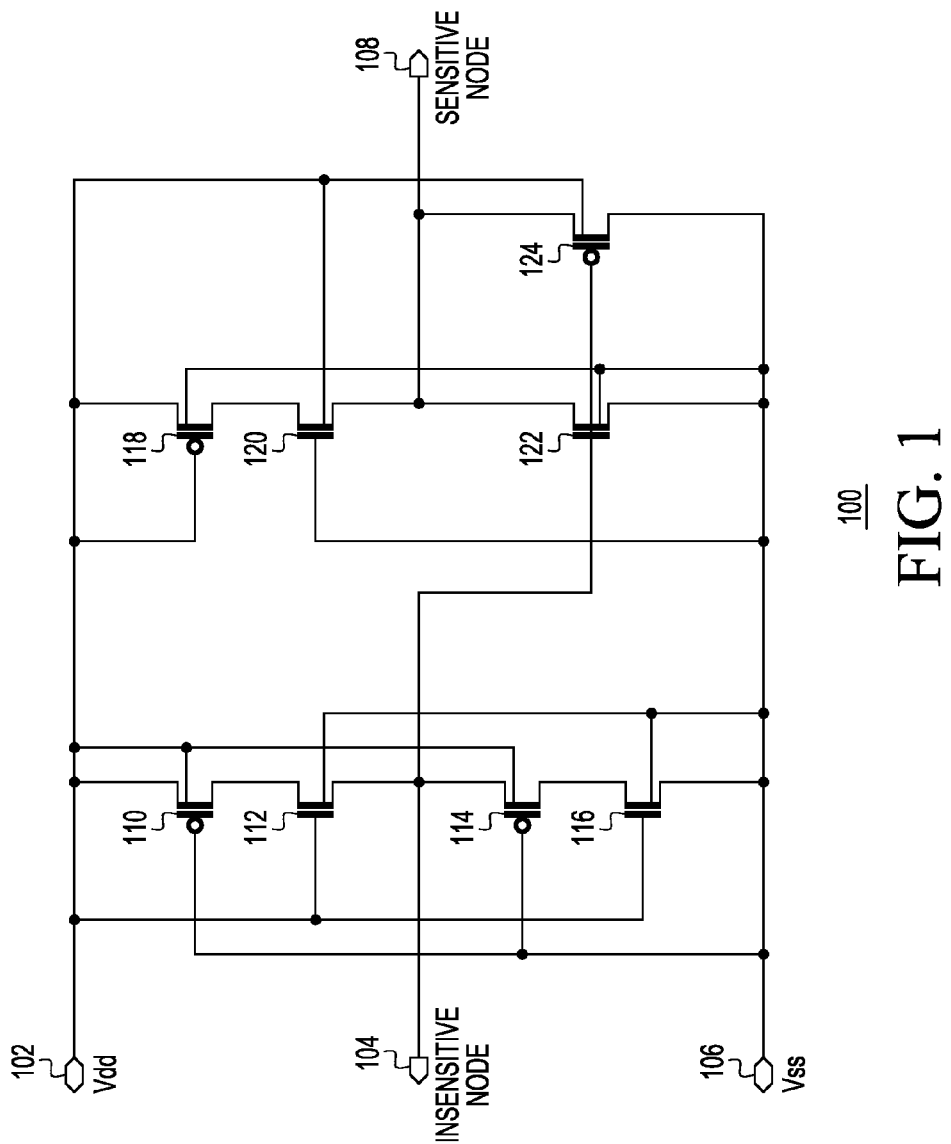
FIG. 1 is a circuit diagram illustrating a sensor circuit for sensing on-chip characteristics, in accordance with an embodiment.

The present disclosure is illustrated by way of example and is not limited by the accompanying figures, in which like reference numbers indicate similar elements. Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present disclosure.

The apparatus and method components have been represented where appropriate by conventional symbols in the drawings, showing only those specific details that are pertinent to understanding the embodiments of the present disclosure so as not to obscure the disclosure with details that will be readily apparent to those of ordinary skill in the art having the benefit of the description herein. Also, the functions included in the flow diagrams do not imply a required order of performing the functionality contained therein.

DETAILED DESCRIPTION

In accordance with the present teachings are sensor circuits that use the difference in temperature characteristics between transistor drive current and transistor leakage current to monitor temperature changes on an IC. At least one embodiment of the present teachings uses the difference in leakage current characteristics between transistors with different gate lengths to monitor IC fabrication variations. Sensor circuits in accordance with embodiments described herein can be fabricated with and located on the IC whose characteristics are being monitored. Thus, no special manufacturing process is needed. Another example benefit is that the sensor circuits take up a relatively small die area and can, therefore, be strategically placed in multiple areas to measure different on-chip characteristics. Moreover, although the sensor circuits have low power consumption, embodiments can be implemented, wherein the sensor circuit is powered off when not in use.

In accordance with one embodiment is a sensor circuit configured for sensing on-chip characteristics. The sensor circuit comprises a first set of transistors configured to generate a first voltage when operating in saturation mode, and a second set of transistors coupled to the first set of transistors. The second set of transistors is configured to contribute to the generation of a second voltage, which indicates an on-chip characteristic, when each transistor in the second set is in subthreshold mode. The sensor circuit further comprises a sense amplifier circuit coupled to the first and second sets of transistors and configured to detect a difference between the first and second voltages to sense the on-chip characteristic. In one illustrative implementation, the sensed on-chip characteristic comprises temperature.

In another implementation, the sensed on-chip characteristic comprises a fabrication variation such as a transistor gate length variation. Moreover, the first set of transistors is configured with at least one transistor characteristic, and wherein the second set of transistors is configured differently from the first set of transistors with regard to the at least one transistor characteristic, which contributes to the generation of the second voltage, and which indicates the on-chip characteristic.

Turning now to FIG. 1, shown therein is a circuit diagram illustrating a sensor circuit 100 for sensing on-chip characteristics, in accordance with an embodiment. Sensor circuit 100 includes: a first set of transistors comprising transistors 110, 112, 114, and 116; a second set of transistors comprising transistors 118 and 120; and a third set of transistors comprising transistors 122 and 124. In an embodiment, all of the transistors shown in FIG. 1, and in FIGS. 2 and 7-10 are MOSFETs having a gate or control terminal and at least two current terminals, e.g., a drain and a source terminal, and a body terminal known as a bulk terminal. The MOSFETs illustrated in FIGS. 1-2 and 7-10 comprise a combination of p-channel metal-oxide semiconductor (PMOS) transistors and n-channel metal-oxide semiconductor (NMOS) transistors with the source, drain and gate connections as illustrated in the drawings. The bulk terminal connection for the PMOS transistors are to an upper power supply voltage, e.g., Vdd, and the bulk terminal connection for the NMOS transistors are to a lower power supply voltage, e.g., Vss unless otherwise stated.

In alternative embodiments, other transistor technology is used, wherein the transistors have known characteristics that can be monitored, which indicate a change in temperature or temperature variation and/or a change or difference in another on-chip characteristic. Moreover, complementary versions of each circuit illustrated in FIGS. 1-2 and 7-10 can be designed by those skilled in the art.

An on-chip characteristic means a measurable or monitorable property of an IC or the components of the IC or a measurable or monitorable property resulting from operation of components of the IC. One example on-chip characteristic is temperature on the chip, which may for instance be affected by ambient temperature, overheating of components during operation, etc. Another example on-chip characteristic is variations on the IC, such as intra-die or within-die variations or differences in components or component characteristics on the IC. These variations are caused by or during the IC fabrication or manufacturing process and are referred to herein as fabrication variations and process variations. Such fabrication variations can include, but are not limited to, transistor gate length variations also referred to herein as line variations, voltage threshold variations, etc. For example, on a real wafer, the transistor gates have variations across the wafer. Some of the transistor gates are much narrower in some places than in other places, and the roughness at the gates edges could be different. Such differences can cause significant transistor leakage differences that circuits in accordance with the present teachings are designed to detect.

A transistor gate length, also sometimes referred to in the art as channel length, is the distance between the source and drain of a MOSFET. Transistor gate length could be, for instance: measured from the photo mask; the actual length between source and drain edges; or the effective gate length, which takes into account encroachment features underneath the gate. The voltage threshold, also known as the threshold voltage, of a MOSFET is the gate voltage where an inversion layer forms at an interface between the insulating layer, i.e., oxide, and the substrate, i.e., body, of the transistor. The formation of the inversion layer allows the flow of electrons through the gate-source junction.

Turning again to the description of the elements of the sensor circuit 100, in an embodiment, transistors 110, 114, 118, and 124 are PMOS transistors, and transistors 112, 116, 120, and 122 are NMOS transistors. Transistor 110 has a source terminal coupled to a node 102, which receives a first power supply voltage Vdd, which can be for example around 1.0 volts (V), although different values of Vdd could be used. Transistor 110 has a gate coupled to a node 106, which receives a second power supply voltage Vss, which is lower than Vdd. In one embodiment, Vss is at a ground potential, i.e., ground. The drain of transistor 110 is coupled to the drain of transistor 112. The gate of transistor 112 is coupled to node 102, and the source of transistor 112 is coupled to a node 104, referred to herein as an "insensitive" node, since the voltage at the node is substantially insensitive to changes in on-chip characteristics like temperature changes and line variations. The source of transistor 114 is coupled to node 104. The gate of transistor 114 is coupled to node 106, and the drain of transistor 114 is coupled to the drain of transistor 116. The gate of transistor 116 is coupled to node 102, and the source of transistor 116 is coupled to node 106.

The source and gate of transistor 118 are coupled to node 102, and the drain of transistor 118 is coupled to the drain of transistor 120. The bulk connection for PMOS transistor 118 is coupled to Vss at node 106 instead of Vdd at node 102. Transistor 120 has a gate coupled to node 106 and a source coupled to a node 108, referred to herein as a "sensitive" node, since the voltage at the node is sensitive to changes in on-chip characteristics like temperature changes and line variations. The bulk connection for NMOS transistor 120 is coupled to Vdd at node 102 instead of Vss at node 106. The transistor 122 has a drain coupled to node 108, a gate coupled to node 104, and a source coupled to node 106. Transistor 124 has a source coupled to node 108, a gate coupled to node 104, and a drain coupled to node 106.

In accordance with the teachings herein, the sensor circuit 100 is designed such that the transistors 110, 112, 114, and 116 coupled to the insensitive node 104 have different characteristics than at least some of the transistors, e.g., 118 and 120, coupled to the sensitive node 108. The sensor circuit is, thereby, designed such that a voltage at the insensitive node stays substantially constant irrespective of one or more particular on-chip characteristics; whereas, a voltage at the sensitive node is dependent upon, e.g., is a function of, the same given one or more on-chip characteristics. Thus, the second voltage serves to indicate the one or more on-chip characteristics. Accordingly, the difference in voltage between the insensitive node 104 and the sensitive node 108 acts as a mean to enable a sensing or detection of those particular one or more on-chip characteristics and/or changes in those particular one or more on-chip characteristics.

Stated another way, a first set of transistors, e.g., 110, 112, 114, and 116, is configured with at least one transistor characteristic, and a second set of transistors, e.g., 118 and 120, is configured differently from the first set of transistors with regard to the at least one transistor characteristic, which contributes to the generation of the second voltage, and which indicates the on-chip characteristic. In addition, in accordance with the arrangement of the transistors in the sensor circuit 100, a third set of transistors, e.g., 122 and 124, coupled to the first and second sets of transistors, is configured to contribute to the generation of the second voltage when the transistors in the third set are operating in triode mode or in saturation mode.

For example, the at least one transistor characteristic comprises gate length, and each transistor in the first set of transistors is configured to have a longer gate length than a gate length of each transistor in the second set of transistors. In an embodiment, the transistors 110, 112, 114, and 116 are long-channel devices, and the transistors 118 and 120 are short-channel devices. In a further embodiment, the transistors 122 and 124 are also long-channel devices. A long-channel device is one that is designed to behave according to the square-law model. Whereas, a short-channel device's behavior is not accurately predicted by the square-law model. In one particular embodiment, the transistors 110, 112, 114, and 116 are designed to have a longer gate length than the transistors 118 and 120 by an order of between five and ten. For example, the transistors 110, 112, 114, and 116 have a gate length of more than five micrometers and in one particular embodiment around 10 micrometers, and the transistors 118 and 120 have a gate length of substantially less than one micrometers and in one embodiment around 50 nanometers.

A benefit of using long-channel devices is the minimization of subthreshold leakage current in subthreshold mode and the stability of the drain current when the device is driven into saturation mode, not-withstanding temperature on the die, for instance. Subthreshold mode, also referred to as cut-off or weak-inversion mode, is when the voltage applied between the gate and source ($V_{GS}$) of the transistor is less than the voltage threshold ($V_{th}$) of the transistor. Triode mode or the linear region is when $V_{GS} > V_{th}$ and the voltage between the drain and source ($V_{DS}$) is less than ($V_{GS} - V_{th}$). Saturation or active mode is when $V_{GS} > V_{th}$ and $V_{DB}$ is greater than or equal to ($V_{GS} - V_{th}$). The current while a device is in saturation mode is referred to herein as the drive current. The stability of the drive current causes corresponding stability of the voltage at the insensitive node 104 even during temperature changes on the die. Moreover, variations in line width, also referred to herein as gate length variations and line variations, resulting from random process variations, have little to no impact on the drive current and, hence, the voltage at the insensitive node 104.

By contrast, the short-channel devices have a higher subthreshold leakage current than the long-channel devices. In addition, where the bulk connection of a PMOS transistor is connected to Vss instead of Vdd, this increases a voltage difference $V_{GB}$ between the gate and body terminals, thereby creating a depletion layer. This, in turn, increases the current conductivity between the source and drain terminals and tends to increase the subthreshold leakage current through the PMOS device. Likewise, where the bulk connection of a NMOS transistor is connected to Vdd instead of Vss, this increases a voltage difference $V_{GB}$ between the gate and body terminals, thereby creating a depletion layer. This, in turn, increases the current conductivity between the source and drain terminals and tends to increase the sub-threshold leakage current through the NMOS device.

Moreover, although only one of each transistor 118 and 120 are shown, multiple such transistors can be coupled in parallel to control the amount of subthreshold leakage current through the devices. The size of the transistors 118 and 120 can in addition to, or alternatively, be used to control the amount of subthreshold leakage current through the transistors 118 and 120. In addition, the shorter the gate length the more sensitive the transistor is to both temperature and line variation. However, as the gate length increases, the sensitivity to line variation decreases at a more rapid rate than the transistor's sensitivity to temperature. In this manner, sensor circuits can be designed that are more suitable to a subset of on-chip characteristics. For example, a sensor circuit can be designed that is more suitable to monitoring temperature and not line variation.

As used herein, the subthreshold leakage current, also referred to in the art as the weak-inversion current, is the conduction through a transistor when $V_{GS} < V_{th}$ when the device is supposed to be off. A property of subthreshold leakage current is that it is affected in a predictable way by some on-chip characteristics such as temperature and line variation. Accordingly, in various circuit arrangements, some examples of which are described herein, the voltage at the sensitive node 108 indicates an on-chip characteristic such as line variation or a change in an on-chip characteristic such as temperature when the transistors are operating in the proper mode, e.g., subthreshold mode, triode mode, or saturation mode.

In yet another embodiment, the short-channel devices 118 and 120 have a lower threshold voltage, e.g., around 0.2 V as compared to around 0.4 V for the long-channel devices. The lower threshold voltage also tends to increase the subthreshold leakage current through the device. Thus, in accordance with this embodiment, the at least one different transistor characteristic between the first set of transistors 110-116 and the second set of transistors 118 and 120 comprises voltage threshold. Particularly, each transistor in the first set of transistors is configured to have a higher voltage threshold than a voltage threshold of each transistor in the second set of transistors. A further embodiment implements the transistors 118 and 120 as long-channel devices with the lower threshold voltage to create the subthreshold leakage current through those devices.

We now return to the arrangement of the transistors 110-124 of circuit 100 to enable the circuit to generate the voltages at the insensitive node 104 and the sensitive node 108. Further in accordance with the present teachings, based on the arrangement of the transistors within the sensor circuit 100, the voltage difference between the insensitive node 104 and the sensitive node 108 is detectable due to a difference in operating mode between the transistors 110, 112, 114, and 116 coupled to the insensitive node and at least some of the transistors, e.g., 118 and 120, coupled to the sensitive node 108. This is shown by reference to FIG. 3, wherein a flow diagram is shown illustrating a method 300 for sensing on-chip characteristics, in accordance with an embodiment. In one example implementation, at least some of the functionality of method 300 is performed in or by the sensor circuits illustrated and described by reference to FIGS. 1, 2 and 7-10.

At 304, circuit 100 generates a first voltage, e.g., at node 104, using a drive current through a first set of transistors, e.g., 110-116, which are operating in saturation mode. More particularly, when Vdd is applied to node 102, the transistors 110-116 are fully on and driven into saturation mode. Since, the transistors 110-116 are configured as a voltage divider, they generate a voltage at the node 104 that is about halfway between Vdd and Vss. Also since they are long channel devices, which are substantially insensitive to temperature and line variation, the voltage at node 104 remains stable in view of such on-chip characteristics.

At 306, circuit 100 generates a second voltage, e.g., at node 108, using subthreshold leakage current from a second set of transistors, e.g., 118 and 120, that are in subthreshold mode and using a current through a third set of transistors, e.g., 122 and 124, which are operating in triode mode or saturation mode. More particularly, when Vdd is applied to node 102, the transistors 118 and 120 are off, i.e., are in subthreshold mode. As mentioned above, transistors 118 and 120 are designed to have leakage current while they are off, wherein the amount of leakage current is determined, in one embodiment, by the number of transistors 118 and 120 that are arranged in parallel. Moreover, the transistor 118 and 120 arrangement is designed to make the leakage current through these transistors comparable to the current thorough transistors 122 and 124. This, in effect, creates a voltage divider with the voltage at node 108 increasing or decreasing with the leakage current through the transistors 118 and 120.

In an embodiment, generating the first voltage at node 104 using the drive current through the first set of transistors 110-116 comprises generating the first voltage using the first set of transistors configured with a first gate length. Generating the second voltage using the subthreshold leakage current through the second set of transistors 118, 120 comprises generating the second voltage using the second set of transistors configured with a gate length that is shorter than the gate length of the first set of transistors. In a further embodiment the voltage at node 108 is generated based on a difference in threshold voltage between the first set of transistors 110-116 and the second set of transistors 118, 120.

The transistors 122 and 124 are designed to have voltage thresholds such that the voltage at node 104, which is applied to the gate of these transistors, causes the transistors to operate in the triode region. This provides a relatively stable current through transistors 122 and 124, since they are driven by a voltage that has no appreciable change over temperature and process variations. Nonetheless, this arrangement allows the voltage at node 108 to respond quickly with the change in leakage current through the transistors 118 and 120.

Figure 2:
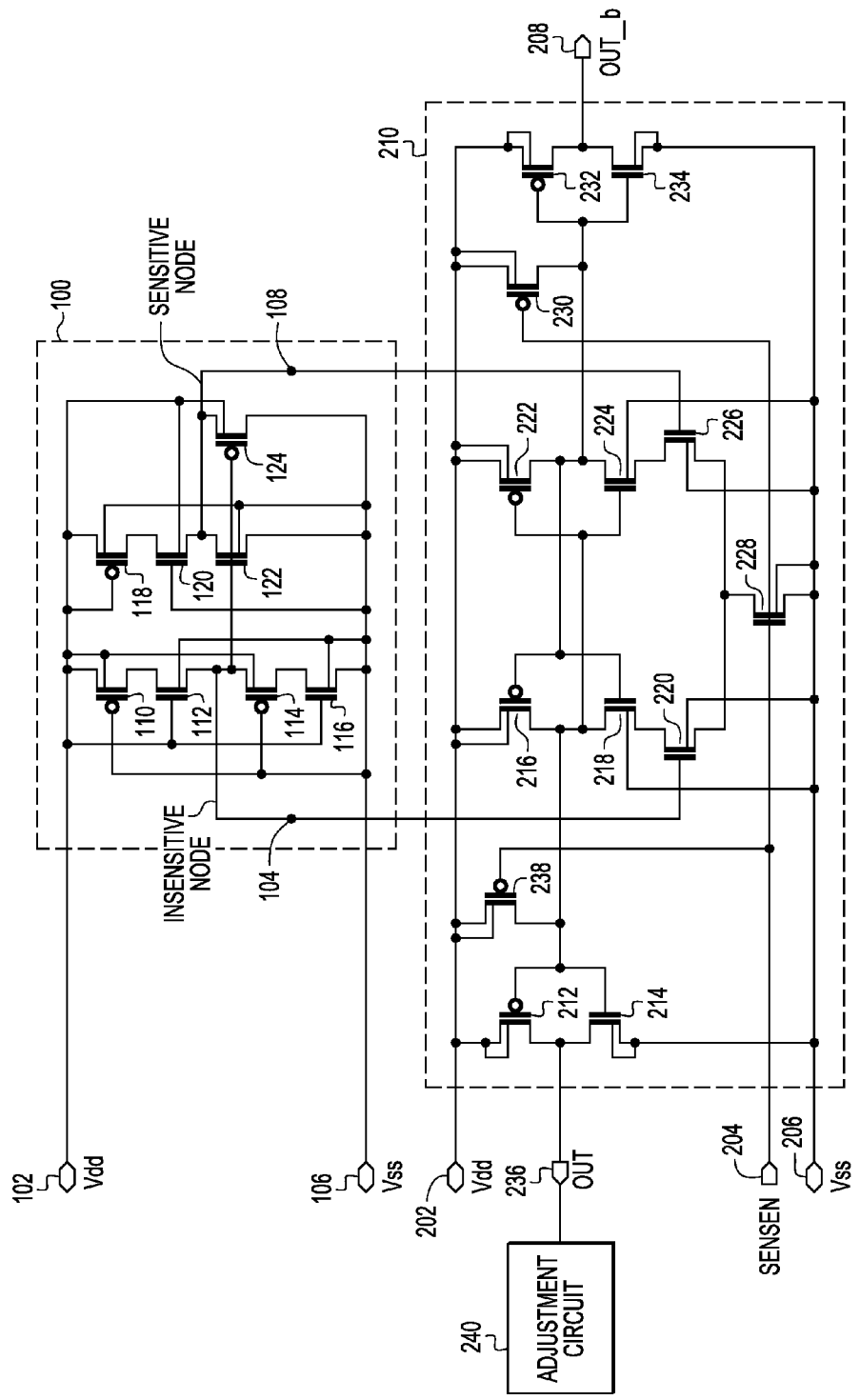
FIG. 2 is a circuit diagram illustrating a sensor circuit for sensing on-chip characteristics, in accordance with another embodiment.
Figure 3:
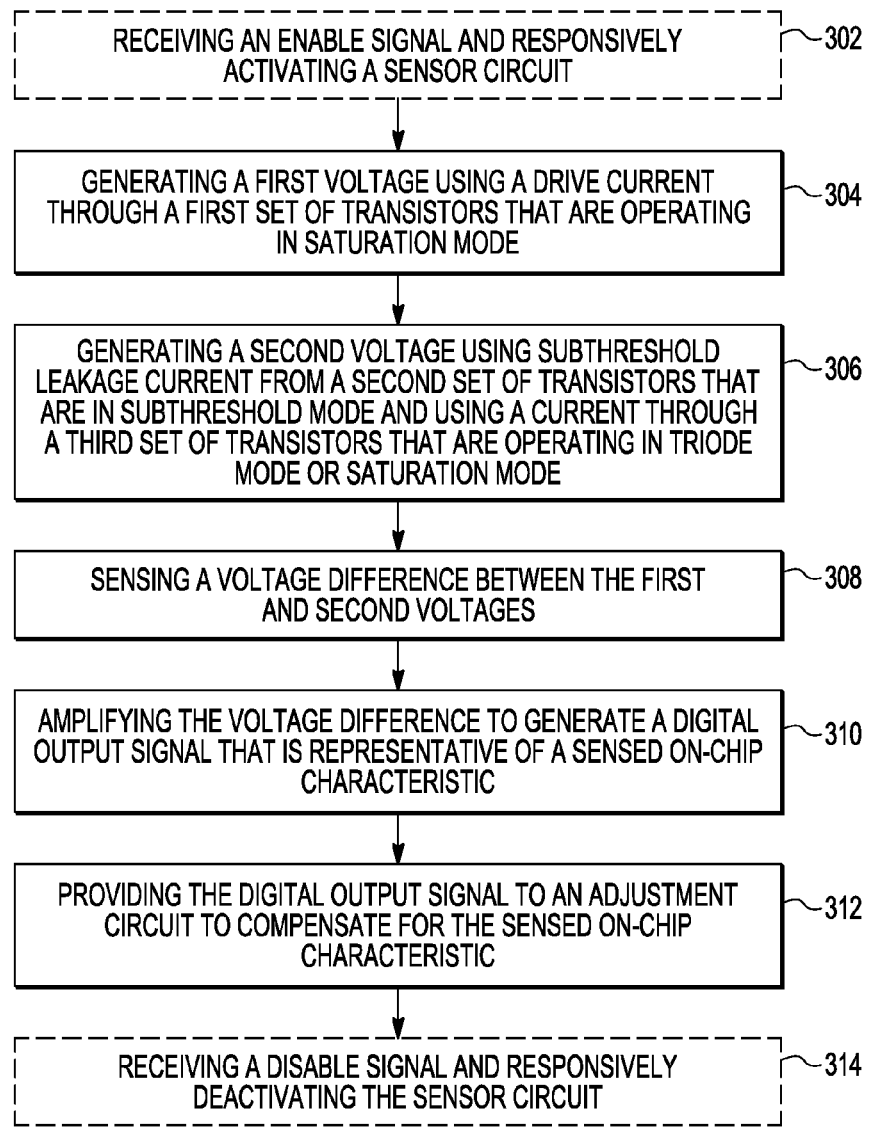
FIG. 3 is a flow diagram illustrating a method for sensing on-chip characteristics, in accordance with an embodiment.

Circuit 100 generates the voltages at the insensitive node 104 and the sensitive node 108 that are compared to sense an on-chip characteristic such as temperature or line variation. FIG. 2 illustrates a sensor circuit 200, in accordance with an embodiment, that includes a sense amplifier circuit 210. The sense amplifier circuit 210 is coupled to the first set of transistors 110, 112, 114, and 116 to receive the voltage at the insensitive node 104 and is further coupled to the second sets of transistors 118, 120, to receive the voltage at the sensitive node 108. The sense amplifier circuit 210 compares the second voltage to the first voltage in order to sense an on-chip characteristic. In the particular embodiment shown, the sense amplifier circuit 210 comprises a set of transistors having a sense amplifier configuration to: at 308 of method 300, detect or sense a voltage difference between the first and second voltages at nodes 104 and 108; and at 310 of method 300, amplify the voltage difference to generate a digital output signal that is representative of the sensed on-chip characteristic.

More particularly, the sense amplifier circuit 210 includes transistors 212-234 and 238. In the embodiment shown, transistors 212, 216, 222, 230, 232, and 238 are PMOS transistors, and transistors 214, 218, 220, 224-228, and 234 are NMOS transistors. For transistor 212, the source is coupled to a node 202 to receive Vdd; the drain is coupled to the drain of transistor 214 at a first output node 236 that provides an output signal labeled "out"; and the gate is coupled to the gate of transistor 214 and the drain of transistor 238. The source of transistor 214 is coupled to a node 206 to receive Vss. For transistor 216, the source is coupled to node 202; the drain is coupled to the drain of transistor 218 and to the gates of transistors 212, 214, 222, and 224; and the gate is coupled to the gate of transistor 218. The source of transistor 218 is coupled to the drain of transistor 220. For transistor 220, the source is coupled to the source of transistor 226 and the drain of transistor 228; and the gate is coupled to receive the voltage at the insensitive node 104.

For transistor 222, the source is coupled to node 202; and the drain is coupled to the drains of transistors 224 and 230 and to the gates of transistors 216, 218, 232, and 234. The source of transistor 224 is coupled to the drain of transistor 226. The gate of transistor 226 is coupled to receive the voltage at the sensitive node 108. For transistor 228, the source is coupled to node 206; and the gate is coupled to the gates of transistors 230 and 238 at a node 204 to receive a voltage signal labeled "sensen". In an embodiment, sensen switches between 1.0 V and 0V. The source of transistor 230 is coupled to node 202. The source of transistor 232 is coupled to node 202; and the drain is coupled to the drain of transistor 234 at a node 208 a second output node 208 that provides an output signal labeled "out_b". Out_b is a complimentary signal to the signal out at node 236. The source of transistor 234 is coupled to node 206.

The sense amplifier circuit 210 operates as a conventional voltage sense amplifier. Particularly, the sense amplifier senses the voltages at nodes 104 and 108 and amplifies the small analog voltage swing to recognizable logic levels '1' and '0' so the data can be interpreted properly at the first and second output nodes 236 and 208.

Figure 4:
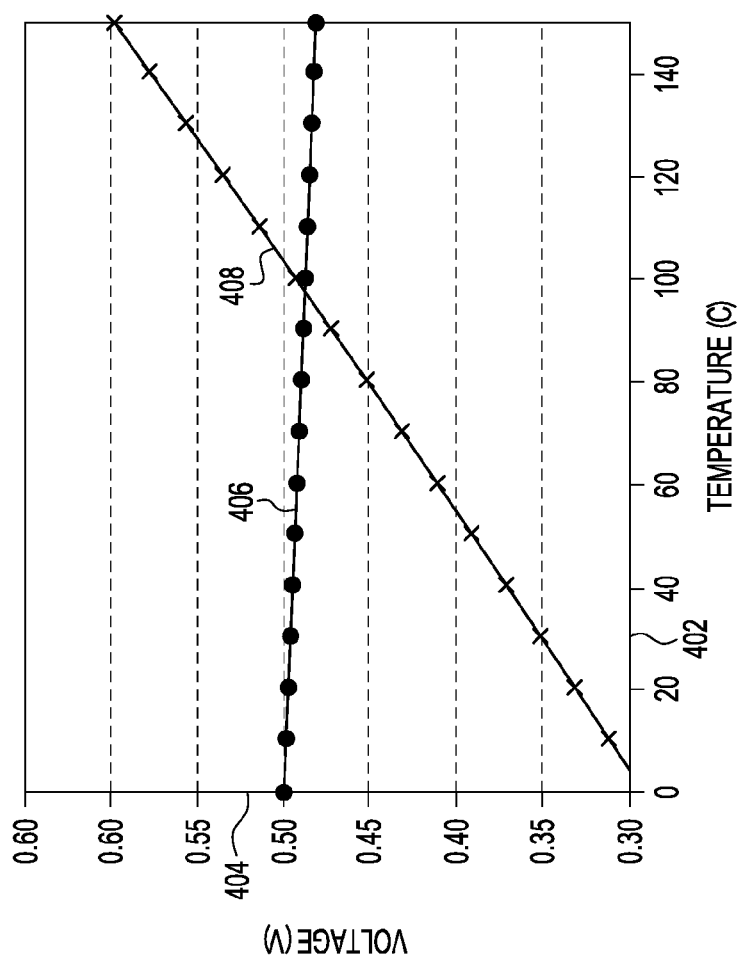
FIG. 4 illustrates plots of voltage versus temperature for a temperature insensitive node and a temperature sensitive node within the sensor circuits shown in FIG. 1 and FIG. 2.

Turning to FIG. 4, illustrated therein is a diagram 400 showing two curves 406 and 408, which both plot voltage in V along a y-axis 404 versus temperature in Celsius (C) along an x-axis 402. The curve 406 represents the voltage at the insensitive node 104 over varying temperature. The curve 408 represents the voltage at the sensitive node 108 over varying temperature. As can be seen, the voltage at node 104 is relatively stable over temperature, at around halfway between Vdd and Vss, as compared to the voltage at the node 108. By contrast, the voltage at node 108 increases linearly with temperature and, resultantly, with the increase in leakage current through the transistors 118 and 120.

In an embodiment, the point of crossing of the curves 406 and 408 can be used as a threshold for generating the value of the output signals from nodes 208 and 236 of the sense amplifier 210. For example, a positive delta to the right of the crossing creates a logic '1' at node 236 and creates the opposite logic value at node 208. A negative delta to the left of the crossing creates a logic '0' at node 236 and creates the opposite logic value at node 208. This is demonstrated with respect to the curves shown in diagrams 500 and 520 of FIG. 5.

Figure 5:
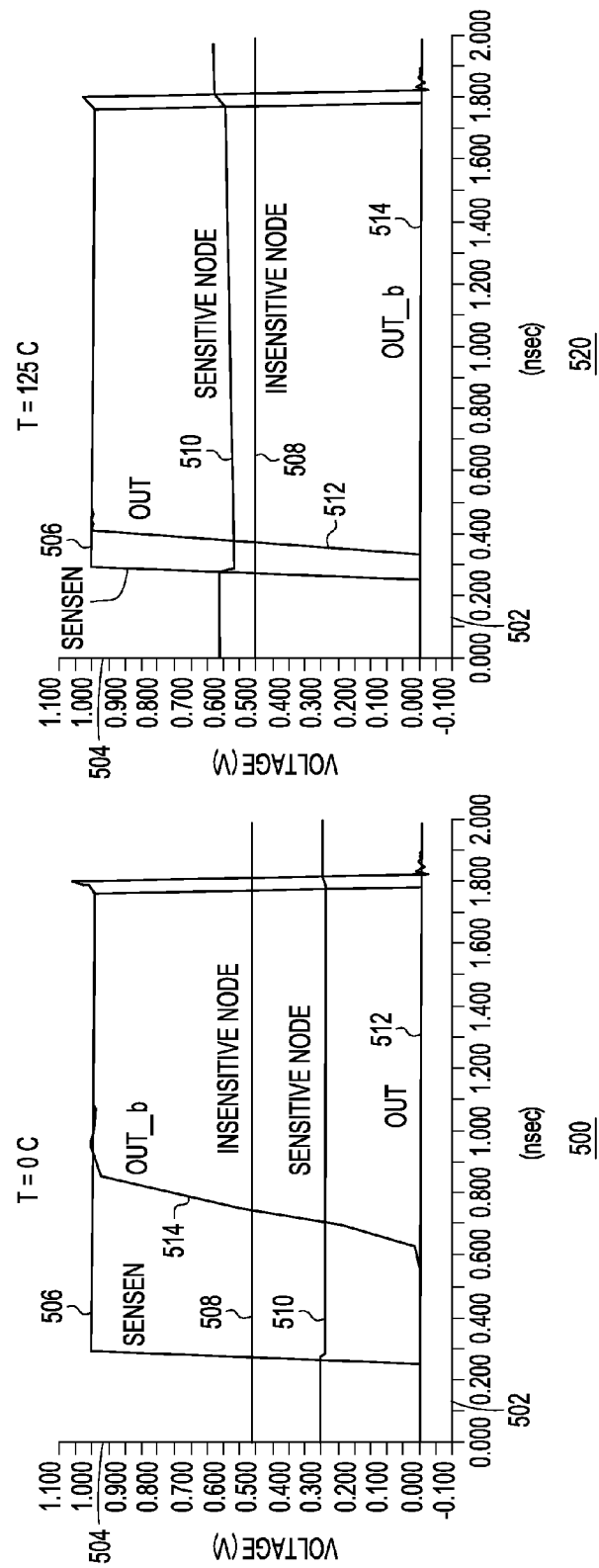
FIG. 5 is a diagram depicting a control signal into and a digital output signal from the sensor circuit shown in FIG. 2 to facilitate monitoring of on-chip characteristics, in accordance with an embodiment.

Diagrams 500 and 520 of FIG. 5 illustrate curves 506-514, which plot voltage in V along a y-axis 504 versus time in nanoseconds (nsec) along an x-axis 502 at different nodes of sensor circuit 200 during two different sampling periods. More specifically, curve 506 represents the sensen signal received into node 204, which controls when the sense amplifier 210 samples the voltages at nodes 104 and 108. Sampling is performed during a time period when sensen is high, as is illustrated, which is referred to as the sampling period.

Diagram 500 shows curves 508-514 during a sampling period of the sensen signal 506 when the temperature on the IC is T=0 C. Diagram 520 shows the curves 508-514 during a sampling period of the sensen signal 506 when the temperature on the IC is T=125 C.

Furthermore, curve 508 represents the voltage at the insensitive node 104. Curve 510 represents the voltage at the sensitive node 108. Curve 512 represents the voltage out at the output node 236, and curve 514 represents the voltage out_b at the output node 208. As can be seen, during the sampling period of the sensen signal 506 when T=0, the voltage at the sensitive node 108 is less than the voltage at the insensitive node 104. This represents a negative delta, wherein circuit 210 generates a logic '0' at the output 236 as shown by curve 512 and a corresponding logic '1' at the output 208 as shown by the curve 514. During the sampling period of the sensen signal 506 when T=125, the voltage at the sensitive node 108 is greater than the voltage at the insensitive node 104. This represents a positive delta, wherein circuit 210 generates a logic '1' at the output 236 as shown by curve 512 and a corresponding logic '0' at the output 208 as shown by the curve 514.

In this manner, the logic value at the output nodes represent the sensed on-chip characteristic of temperature. In an embodiment, at 312 of method 300, the sense amplifier 210 provides the digital output signal to an adjustment circuit 240 to compensate for the sensed on-chip characteristic. Any suitable compensation or adjustment circuit can be implemented on the IC to compensation for a given on-chip characteristic such as temperature or line variation. For example, the digital value is provided to a circuit that decreases the leakage current when the threshold is crossed, for instance by lowering Vdd or performing well biasing to decrease the leakage. Accordingly, the adjustment circuit 240 can be coupled to Vdd to change the supply voltage value and/or the adjustment circuit 240 can be coupled to the transistors 118, 120 to adjust the well biasing for these transistors. This helps to reduce power consumption in the circuit 200 to lower the temperature on the IC. Moreover, the crossing point between the curves 406 and 408 of FIG. 4, which sets the threshold, can be adjusted for different technologies, applications, and products by, for instance, adjusting the transistor sizes and other properties such as gate length, threshold voltage, etc. Also, the behavior at the nodes 104 and 108 exhibit the same properties, as is shown in curves 406 and 408, over different process corners.

Figure 6:
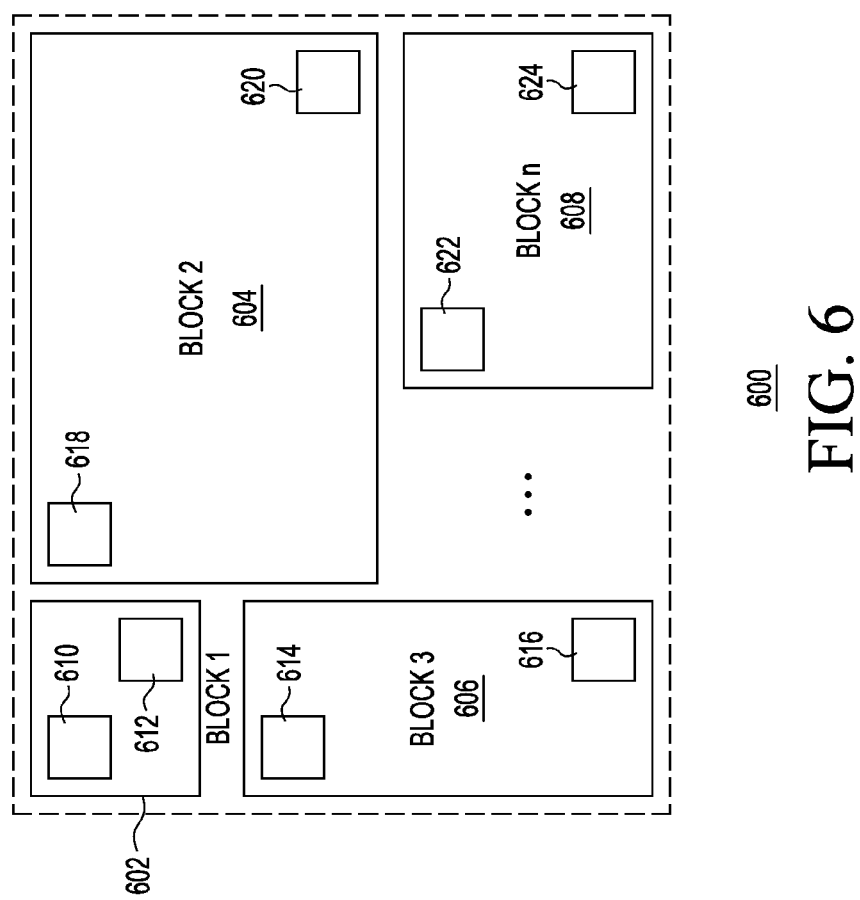
FIG. 6 is a general block diagram depicting areas on an IC wherein a sensor circuit might be located, in accordance with an embodiment.

FIG. 6 illustrates an IC 600 that includes a plurality of circuit blocks 602, 604, 606, and 608, each having one or more sensor circuits in accordance with the present teachings, such as a sensor circuit 200. Each circuit block could represent dedicated processing for a given application or product. As shown, block 602 includes two sensor circuits 610 and 612 located at opposing corners of the block. Block 604 includes two sensor circuits 618 and 620 located at opposing corners of the block. Block 606 includes two sensor circuits 614 and 616 located at opposing corners of the block. Block 608 includes two sensor circuits 622 and 624 located at opposing corners of the block.

One example benefit of the sensor circuits in accordance with the present teachings is their small size which allows the circuits to fit into available space on the chip, for example in corners of the circuit blocks, without increasing the size of the IC to accommodate the sensor circuit. Additionally, although two sensor circuits are shown in each block, only one could be used if available space so dictates. Conversely, more sensor circuits could be placed within a given block for improved accuracy in sensing on-chip characteristics like temperature and line variation to enable improved compensation techniques. When a block contains multiple sensor circuits, the sensor circuits can be used to sense the same on-chip characteristic or different on-chip characteristics. Moreover, since the same sensor circuit design can be used to sense any characteristic that impacts leakage current, placing one or more sensor circuits in an area on the IC known to overheat could lead to improved temperature sensing. Whereas, placing one or more sensor circuits in an area on the IC known to have a stable temperature allows for better monitoring of line variations.

Thus, FIG. 6 illustrates a system that includes an integrated circuit chip and a set of sensor circuits disposed on the integrated circuit chip. Each sensor circuit includes a first set of transistors, a second set of transistors coupled to the first set of transistors, and a sense amplifier circuit coupled to the first and second sets of transistors. The first set of transistors is configured with at least one transistor characteristic and is configured to generate a first voltage at node 104 when operating in saturation mode. The second set of transistors is configured to generate a second voltage at the node 108, which indicates an on-chip characteristic, when a first subset of the second set of transistors is in subthreshold mode and is configured differently from the first set of transistors with regard to the at least one transistor characteristic and when a second subset of the second set of transistors is operating in triode mode or saturation mode. The sense amplifier circuit is configured to sense a voltage difference between the first and second voltages and amplify the voltage difference to generate a digital output signal that is representative of the on-chip characteristic.

Moreover, the integrated circuit chip has at least a first circuit block separated from a second circuit block. The set of sensor circuits comprises a first sensor circuit disposed on the first circuit block and a second sensor circuit disposed on the second circuit block. In an embodiment, the first sensor circuit is configured to sense at least one of temperature or line variation on the first circuit block, and the second sensor circuit is configured to sense at least one of temperature or line variation on the second circuit block.

The sensor circuits shown in FIGS. 1 and 2 have no mechanism to turn the circuits on and off. Therefore, the transistors 118 and 120 that are designed to have leakage current in the off state always consume some level power. This could be significant for an IC, e.g., IC 600, which has a number of such sensor circuits distributed throughout the IC. Accordingly, in a further embodiment, method 300 described functionality to activate and deactivate a sensor circuit to decrease the overall power consumption of the circuit. More particularly, method 300 includes the sensor circuit, at 302, receiving an enable signal and responsively activating the sensor circuit to perform the functionality 304-312 of method 300. Correspondingly, at 314, the sensor circuit receives a disable signal and responsively deactivates the sensor circuit to prevent performance of the functionality 304-312 of method 300.

Figure 7:
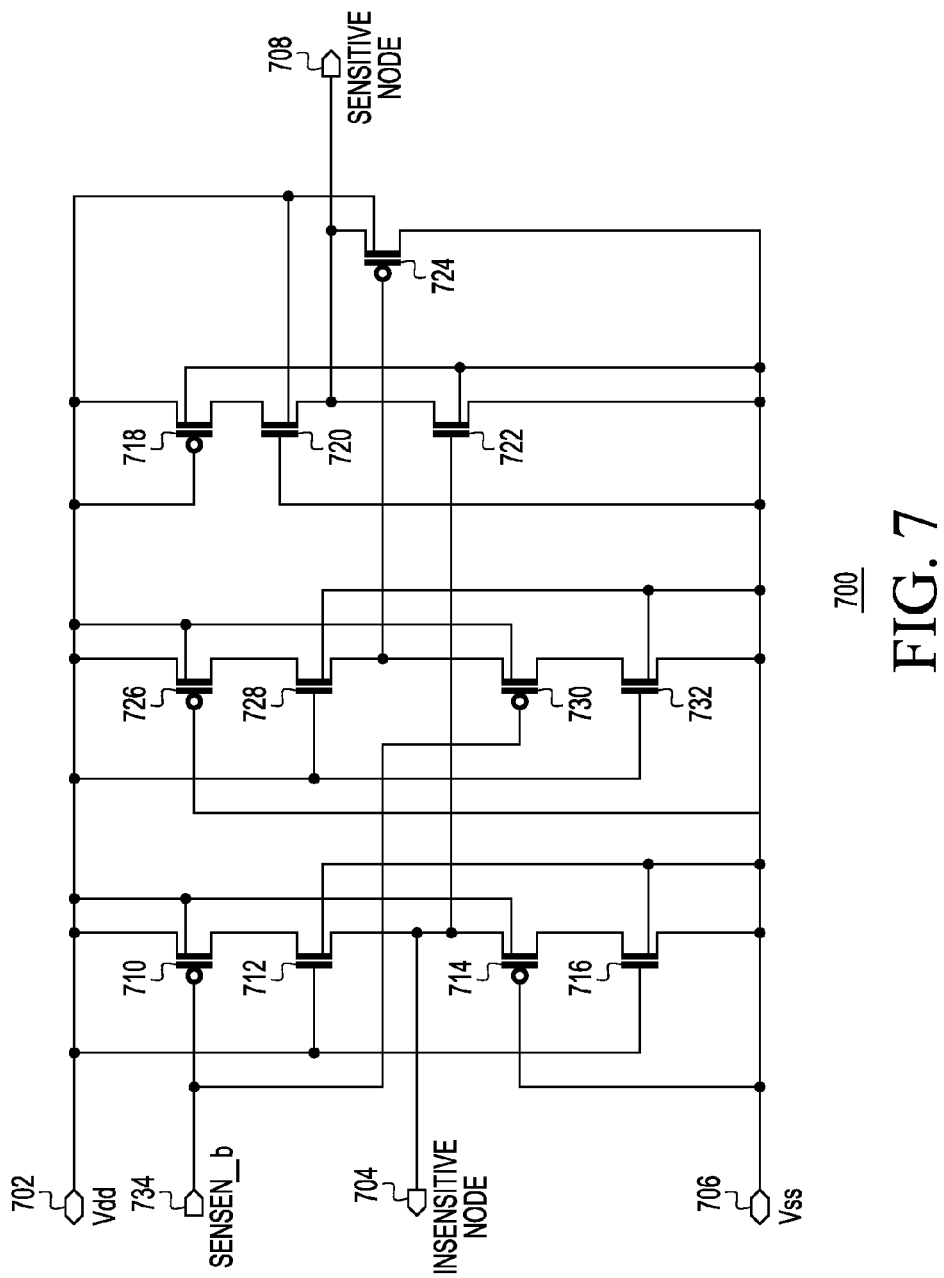
FIG. 7 is a circuit diagram illustrating a sensor circuit for sensing on-chip characteristics, in accordance with another embodiment.

FIG. 7 shows a circuit diagram illustrating a sensor circuit 700 for sensing on-chip characteristics, in accordance with another embodiment, which includes a mechanism for activating and deactivating the sensor circuit. Sensor circuit 700 includes: a first set of transistors comprising transistors 710, 712, 714, and 716; a second set of transistors comprising transistors 718 and 720; a third set of transistors comprising transistors 722 and 724; and a fourth set of transistors 726, 728, 730, and 732. In an embodiment, transistors 710, 714, 718, 724, 726, and 730 are PMOS transistors, and transistors 712, 716, 720, 722, 728, and 732 are NMOS transistors. In addition, the transistors 710, 712, 714, and 716 are long-channel devices, and the transistors 718 and 720 are short-channel devices, as described above, to create a subthreshold leakage current through those devices. Moreover, although only one of each transistor 718 and 720 are shown, multiple such transistors can be coupled in parallel to control the amount of subthreshold leakage current through the devices. The size of the transistors 718 and 720 can in addition to, or alternatively, be used to control the amount of subthreshold leakage current through the transistors 718 and 720.

In a further embodiment, the transistors 722-732 are also long-channel devices. In yet another embodiment, the short channel devices 718 and 720 have a lower threshold voltage, e.g., around 0.2 V as compared to around 0.4 V for the long-channel devices, to increase the subthreshold leakage current through those devices. A further embodiment implements the transistors 718 and 720 as long-channel devices with the lower threshold voltage to create the subthreshold leakage current through those devices.

Transistor 710 has a source terminal coupled to a node 702, which receives a first power supply voltage Vdd, which can be for example around 1.0 volts (V), although different values of Vdd could be used. Transistor 710 has a gate coupled to a node 734, which receives an enable signal sensen_b. Sensen_b provides a clock signal to turn circuit 700 on and off. In an embodiment, sensen_b is the complementary signal of the sensen signal used to clock circuit 200. In one embodiment, sensen_b switches between about 1.0 V and a ground potential, i.e., ground. The drain of transistor 710 is coupled to the drain of transistor 712. The gate of transistor 712 is coupled to node 702, and the source of transistor 712 is coupled to a node 704, referred to herein as an "insensitive" node. The source of transistor 714 is coupled to node 704. The gate of transistor 714 is coupled a node 706, which receives a second power supply voltage Vss, which is lower than Vdd. In one embodiment, Vss is at ground. The drain of transistor 714 is coupled to the drain of transistor 716. The gate of transistor 716 is coupled to node 702, and the source of transistor 716 is coupled to node 706.

The source and gate of transistor 718 are coupled to node 702, and the drain of transistor 718 is coupled to the drain of transistor 720. The bulk connection for PMOS transistor 718 is coupled to Vss at node 706 instead of Vdd at node 702. Transistor 720 has a gate coupled to node 706 and a source coupled to a node 708, referred to herein as a "sensitive" node. The bulk connection for NMOS transistor 720 is coupled to Vdd at node 702 instead of Vss at node 706. The transistor 722 has a drain coupled to node 708, a gate coupled to node 704, and a source coupled to node 706. Transistor 724 has a source coupled to node 708, a gate coupled to the sources of transistors 728 and 730, and a drain coupled to node 706.

Transistor 726 has a source terminal coupled to node 702 and a gate coupled to a node 706. The drain of transistor 726 is coupled to the drain of transistor 728. The gate of transistor 728 is coupled to node 702. The gate of transistor 730 is coupled node 734. The drain of transistor 730 is coupled to the drain of transistor 732. The gate of transistor 732 is coupled to node 702, and the source of transistor 732 is coupled to node 706.

As illustrated, sensen_b is used as a control signal into the gates of transistors 710 and 730. When sensen_b goes high, PMOS transistors 710 and 730 are turned off and disable the two current paths that contain those transistors. However, transistors 714 and 716 are still on and pull node 704 to ground, which turns off the NMOS transistor 722 and shuts down the current path that contains that transistor. Transistors 726 and 728 are on, which pulls the node at the gate of the PMOS transistor 724 high and turns off this transistor, which turns off the leakage path containing transistors 718 and 720. When sensen_b goes low, the circuit is enabled and operates similarly to circuit 100 shown in FIG. 1 and described above.

Figure 8:
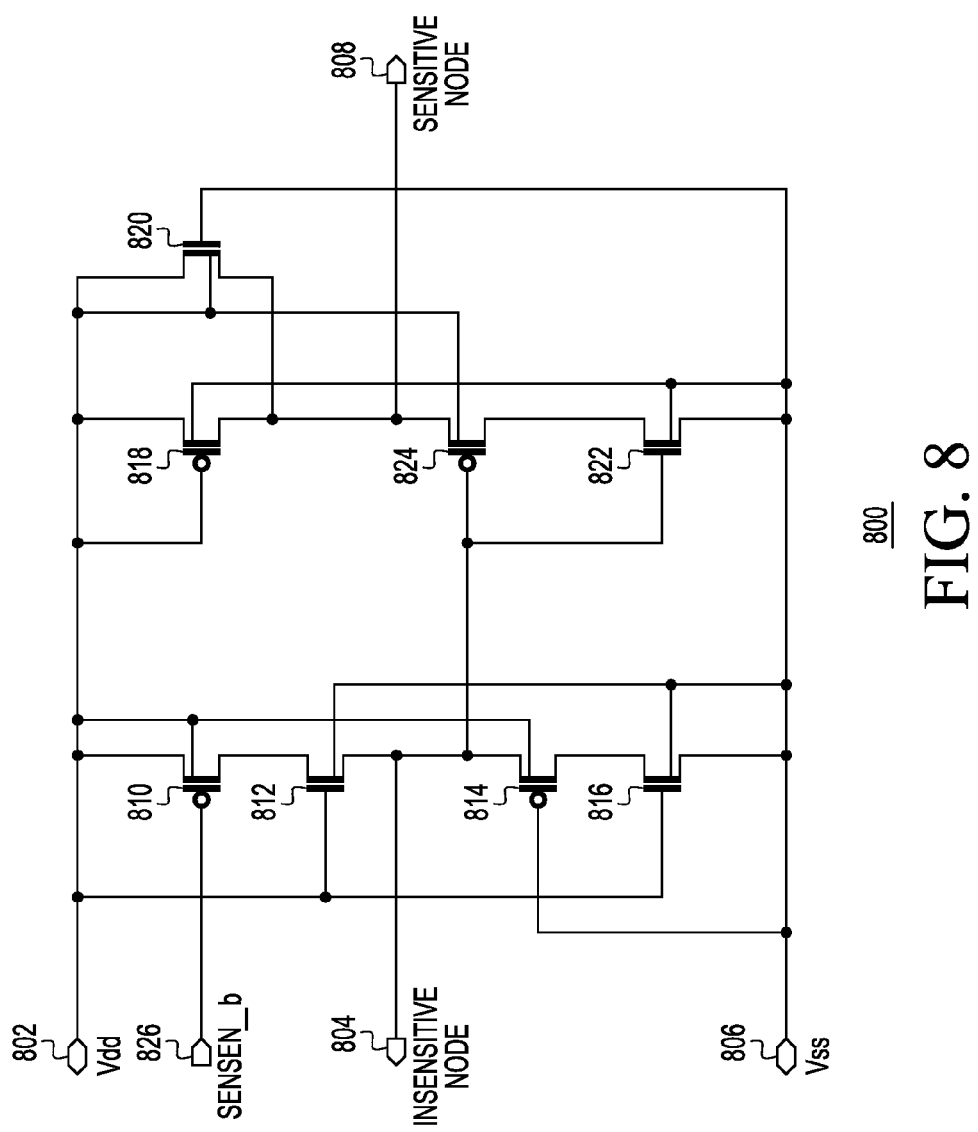
FIG. 8 is a circuit diagram illustrating a sensor circuit for sensing on-chip characteristics, in accordance with another embodiment.

FIG. 8 shows a circuit diagram illustrating a sensor circuit 800 for sensing on-chip characteristics, in accordance with another embodiment, which includes a mechanism for activating and deactivating the sensor circuit. The circuit 800 includes fewer transistors than the circuit 700. Sensor circuit 800 includes: a first set of transistors comprising transistors 810, 812, 814, and 816; a second set of transistors comprising transistors 818 and 820; and a third set of transistors comprising transistors 822 and 824. In an embodiment, transistors 810, 814, 818, and 824 are PMOS transistors, and transistors 812, 816, 820, and 822 are NMOS transistors. In addition, the transistors 810, 812, 814, and 816 are long-channel devices, and the transistors 818 and 820 are short-channel devices, as described above, to create a subthreshold leakage current through those devices. Moreover, although only one of each transistor 818 and 820 are shown, multiple such transistors can be coupled in parallel to control the amount of subthreshold leakage current through the devices. The size of the transistors 818 and 820 can in addition to, or alternatively, be used to control the amount of subthreshold leakage current through the transistors 818 and 820.

In a further embodiment, the transistors 822 and 824 are also long-channel devices. In yet another embodiment, the short channel devices 818 and 820 have a lower threshold voltage, e.g., around 0.2 V as compared to around 0.4 V for the long-channel devices, to increase the subthreshold leakage current through those devices. A further embodiment implements the transistors 818 and 820 as long-channel devices with the lower threshold voltage to create the subthreshold leakage current through those devices.

Transistor 810 has a source terminal coupled to a node 802, which receives a first power supply voltage Vdd, which can be for example around 1.0 volts (V), although different values of Vdd could be used. Transistor 810 has a gate coupled to a node 826, which receives an enable signal sensen_b. Sensen_b provides a clock signal to turn circuit 800 on and off. In an embodiment, sensen_b is the complementary signal of the sensen signal used to clock circuit 200. In one embodiment, sensen_b switches between about 1.0 V and a ground potential, i.e., ground. The drain of transistor 810 is coupled to the drain of transistor 812. The gate of transistor 812 is coupled to node 802, and the source of transistor 812 is coupled to a node 804, referred to herein as an "insensitive" node. The source of transistor 814 is coupled to node 804. The gate of transistor 814 is coupled a node 806, which receives a second power supply voltage Vss, which is lower than Vdd. In one embodiment, Vss is at ground. The drain of transistor 814 is coupled to the drain of transistor 816. The gate of transistor 816 is coupled to node 802, and the source of transistor 816 is coupled to node 806.

The source and gate of transistor 818 are coupled to node 802, and the drain of transistor 818 is coupled to the source of transistor 820 at a node 808, referred to herein as a "sensitive" node. The bulk connection for PMOS transistor 818 is coupled to Vss at node 806 instead of Vdd at node 802. Transistor 820 has a gate coupled to node 806 and a drain coupled to node 802. The bulk connection for NMOS transistor 820 is coupled to Vdd at node 802 instead of Vss at node 806. The transistor 824 has a source coupled to node 808, a gate coupled to node 804, and a drain coupled to the drain of transistor 822. Transistor 822 has a gate coupled to node 808 and a source coupled to node 806.

As illustrated, sensen_b is used as a control signal into the gate of transistor 810. When sensen_b goes high, PMOS transistor 810 is turned off and disables the current path that contains this transistor. However, transistors 814 and 816 are still on and pull node 804 to ground, which turns off the NMOS transistor 822 and shuts down the current path that contains that transistor. When sensen_b goes low, the circuit is enabled and operates similarly to circuit 100 shown in FIG. 1 and described above. In an alternative arrangement, the sensen signal is coupled to the gate of transistor 812, and the gate of transistor 810 is coupled to ground to perform similar circuit functionality.

FIGS. 7 and 8 illustrate embodiments, wherein enable and disable signals are received into at least one transistor within or coupled to the first set of transistors. In this example implementation, the sensor circuits 700, 800 further comprise a control input coupled to at least the first set of transistors, wherein the control input is configured to provide the enable signal to enable at least one current path in the sensor circuit and the disable signal to block at least one current path in the sensor circuit. A current path includes at least one transistor through which current can flow from one node to another node. Particularly, FIGS. 7 and 8 illustrate a control input that comprises an input node, e.g., 734, 826, coupled to at least one transistor, e.g., 710, 810, in the first set transistors. As shown in FIGS. 7 and 8, the enable and disable signals are received into the gate of the transistors 710, 810, within the first set of transistors through the input nodes 734, 826 coupled, respectively, to the transistors 710, 810.

Figure 9:
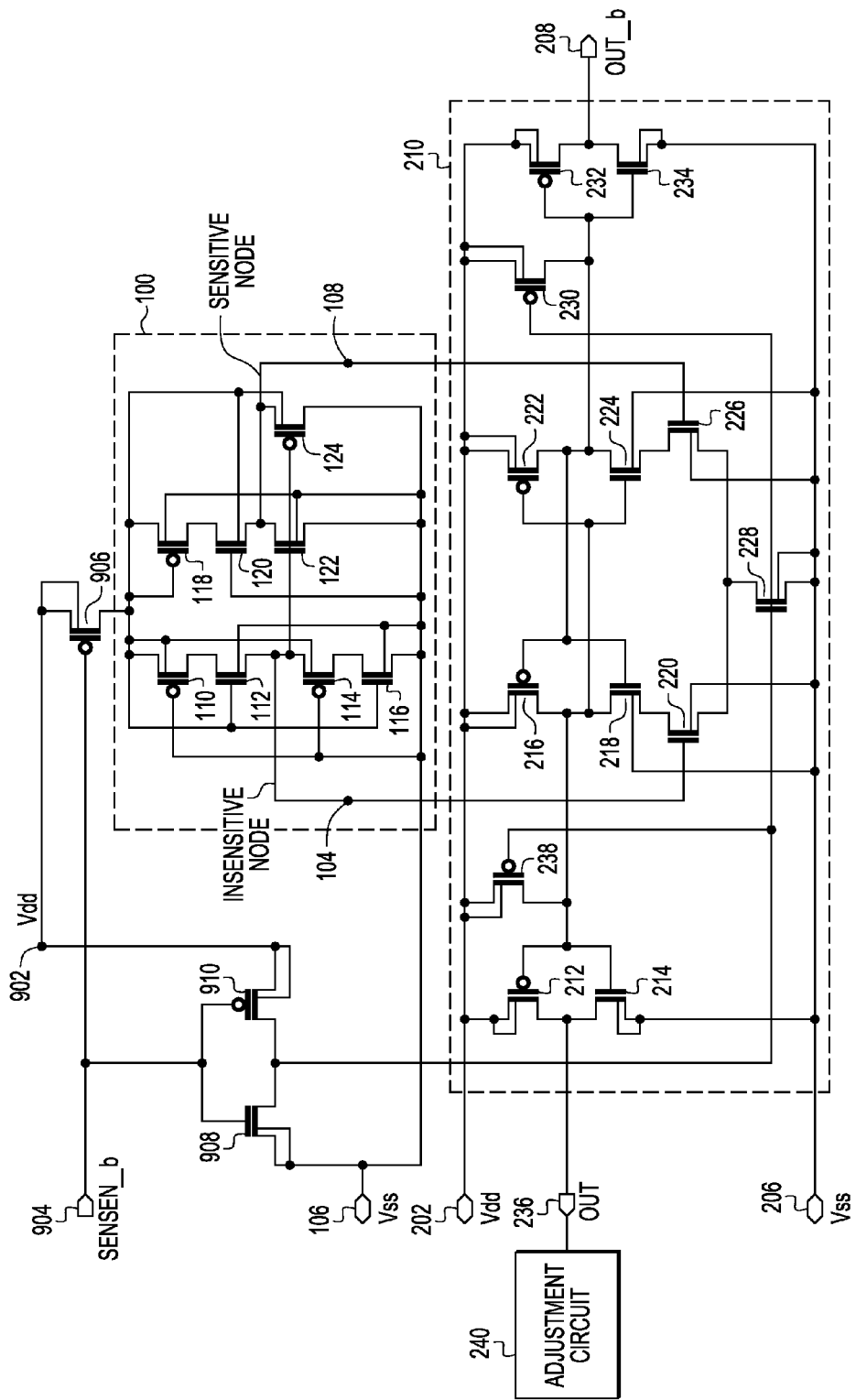
FIG. 9 is a circuit diagram illustrating a sensor circuit for sensing on-chip characteristics, in accordance with another embodiment.

FIG. 9 shows a circuit diagram illustrating a sensor circuit 900 for sensing on-chip characteristics, in accordance with alternative embodiment, which includes a mechanism for activating and deactivating the sensor circuit. The circuit 900 illustrated in FIG. 9 implements a control input comprising a MOSFET coupled to at least one power supply source configured to provide a power supply voltage for the first (e.g., 110-116), second (e.g., 118, 120), and third (e.g., 122, 124) sets of transistors of the sensor circuit, wherein this MOSFET is referred to herein as a power-gating transistor. Particularly, the enable signal is received into the power-gating transistor to provide a power supply voltage to activate the sensor circuit. The disable signal is received into the power-gating transistor to remove the power supply voltage to deactivate the sensor circuit.

The sensor circuit 900, is similar to the sensor circuit 200 shown in FIG. 2 and, thereby, includes the circuit 100, which generates voltages at the insensitive node 104 and the sensitive node 108, when the sensor circuit 900 is activated. Sensor circuit 900 further includes the sense amplifier circuit 210 that senses the difference between the voltages at the nodes 104 and 108, and provides a digital output signal based on the voltage difference, when the sensor circuit is activated. However, one primary difference between sensor circuits 200 and 900 is that circuit 900 includes a PMOS power-gating transistor 906 coupled between a power supply source (not shown) that supplies a power supply voltage Vdd at a node 902 and at least one transistor within the first, second, and third set of transistors of circuit 100.

More specifically, the source of transistor 906 is coupled to the node 902. The transistor 906 has a gate coupled a node 904, which receives an enable signal sensen_b. Sensen_b provides a clock signal to turn circuit 900 on and off. In an embodiment, sensen_b is the complementary signal of the sensen signal used to clock circuit 200. In one embodiment, sensen_b switches between about 1.0 V and a ground potential, i.e., ground. The drain of transistor 906 is coupled to the source of transistors 110 and 118 and the gates of transistors 112, 116, and 118. Another difference is that sensor circuit 900 further includes NMOS transistor 908 and PMOS transistor 910. The gates of transistors 908 and 910 are coupled together at node 904. The drains of transistors 908 and 910 are coupled together and further coupled to supply the sensen signal to the gates of transistors 228, 230, and 238. The source of the transistor 908 is coupled to Vss at node 106, and the source of the transistor 910 is coupled to Vdd at node 902.

Circuit 900 operates similarly to circuit 200 shown in FIG. 2 except that the sensen_b signal applied to the gate of the transistor 906 controls when the circuit 100 is powered. When sensen_b is high, this turns off transistor 906 and removes the power supply voltage Vdd from circuit 100, thereby shutting down the circuit and all current paths through the circuit. Conversely, when sensen_b is low, this turns on transistor 906, which then provides the power supply voltage Vdd to circuit 100, thereby activating the circuit to enable the sense amplifier 210 to sample the voltages at nodes 104 and 108 to provide output signals at the two output nodes 236 and 208.

Figure 10:
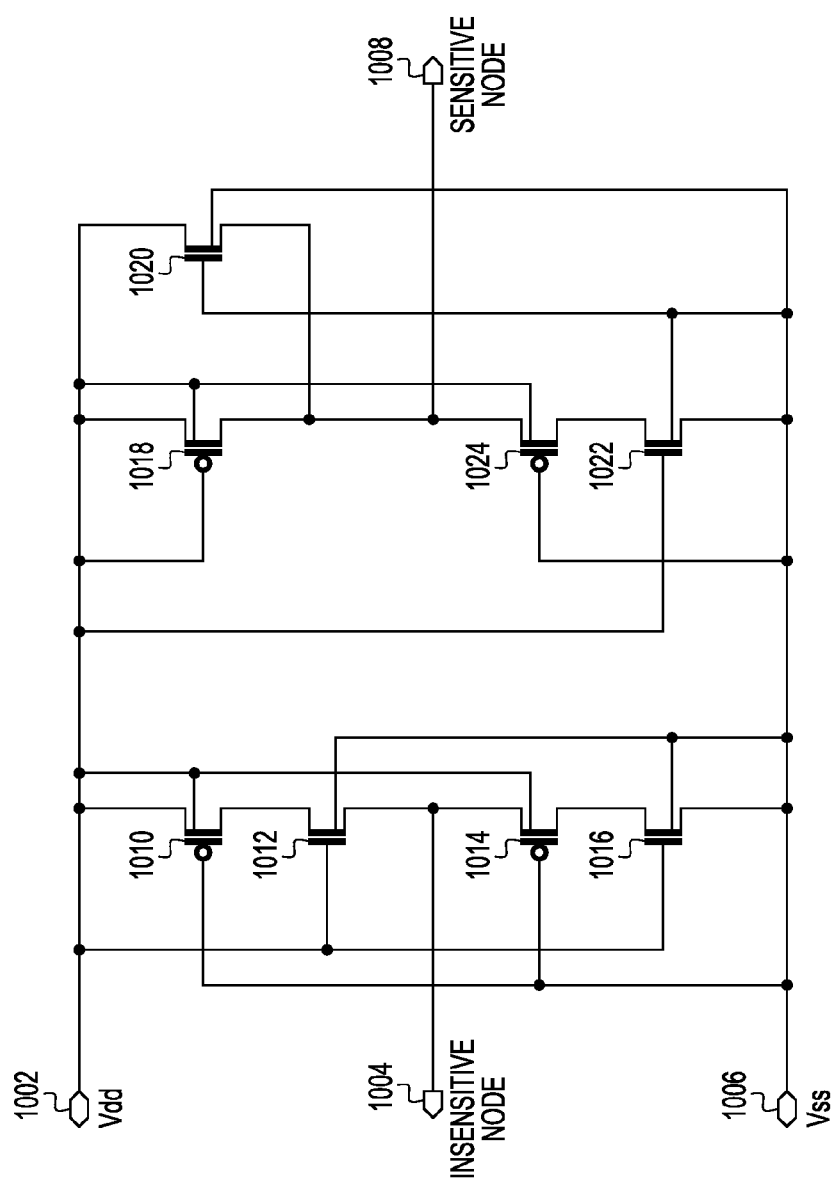
FIG. 10 is a circuit diagram illustrating a sensor circuit for sensing on-chip characteristics, in accordance with another embodiment.

FIG. 10 shows a circuit diagram illustrating a sensor circuit 1000 for sensing on-chip characteristics, in accordance with another embodiment. Sensor circuit 1000 includes: a first set of transistors comprising transistors 1010, 1012, 1014, and 1016; a second set of transistors comprising transistors 1018 and 1020; and a third set of transistors comprising transistors 1022 and 1024. In an embodiment, transistors 1010, 1014, 1018, and 1024 are PMOS transistors, and transistors 1012, 1016, 1020, and 1022 are NMOS transistors. In addition, the transistors 1010, 1012, 1014, and 1016 are long-channel devices, and the transistors 1018 and 1020 are short-channel devices, as described above, to create a subthreshold leakage current through those devices. Moreover, although only one of each transistor 1018 and 1020 are shown, multiple such transistors can be coupled in parallel to control the amount of subthreshold leakage current through the devices. The size of the transistors 1018 and 1020 can in addition to, or alternatively, be used to control the amount of subthreshold leakage current through the transistors 1018 and 1020.

In a further embodiment, the transistors 1022 and 1024 are also long-channel devices. In yet another embodiment, the short channel devices 1018 and 1020 have a lower threshold voltage, e.g., around 0.2 V as compared to around 0.4 V for the long-channel devices, to increase the subthreshold leakage current through those devices. A further embodiment implements the transistors 1018 and 1020 as long-channel devices with the lower threshold voltage to create the subthreshold leakage current through those devices.

Transistor 1010 has a source terminal coupled to a node 1002, which receives a first power supply voltage Vdd, which can be for example around 1.0 volts (V), although different values of Vdd could be used. Transistor 1010 has a gate coupled to a node 1006, which receives a second power supply voltage Vss, which is lower than Vdd. In one embodiment, Vss is at ground. The drain of transistor 1010 is coupled to the drain of transistor 1012. The gate of transistor 1012 is coupled to node 1002, and the source of transistor 1012 is coupled to a node 1004, referred to herein as an "insensitive" node. The source of transistor 1014 is coupled to node 1004. The gate of transistor 1014 is coupled node 1006. The drain of transistor 1014 is coupled to the drain of transistor 1016. The gate of transistor 1016 is coupled to node 1002, and the source of transistor 1016 is coupled to node 1006.

The source and gate of transistor 1018 are coupled to node 1002, and the drain of transistor 1018 is coupled to the source of transistor 1020 at a node 1008, referred to herein as a "sensitive" node. The bulk connection for PMOS transistor 1018 is coupled to node 1002 as is common for PMOS transistors. Transistor 1020 has a gate coupled to node 1006 and a drain coupled to node 1002. The bulk connection for NMOS transistor 1020 is coupled to Vss at node 1006 as is common for NMOS transistors. The transistor 1024 has a source coupled to node 1008, a gate coupled to node 1006, and a drain coupled to the drain of transistor 1022. Transistor 1022 has a gate coupled to node 1002 and a source coupled to node 1006.

Circuit 1000 operates similarly to circuit 100 shown in FIG. 1 except that the transistors 1022 and 1024 are operated in saturation mode. In this embodiment, transistors 1022 and 1024 are long-channel devices with similar characteristics as the transistors 1010-1016.

In the foregoing specification, specific embodiments have been described. However, one of ordinary skill in the art appreciates that various modifications and changes can be made without departing from the scope of the disclosure as set forth in the claims below. Accordingly, the specification and figures are to be regarded in an illustrative rather than a restrictive sense, and all such modifications are intended to be included within the scope of present teachings. The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendment made during the pendency of this application and all equivalents of those claims as issued.

For the sake of brevity, conventional techniques related to semiconductor fabrication including those using conventional CMOS technology, CMOS devices, MOSFETs, sense amplifiers, and other functional aspects of a system or IC, and the individual system or IC operating components, may not be described in detail. Furthermore, the connecting lines shown in the various figures contained herein are intended to represent example functional relationships and/or physical couplings between the various elements. It should be noted that many alternative or additional functional relationships or physical connections may be present in a practical embodiment. Moreover, the various IC embodiments described above may be produced or fabricated using conventional semiconductor processing techniques, e.g., well known CMOS techniques. Further, a variety of well-known and common semiconductor materials may be used, e.g., traditional metals such as aluminum, copper, gold, etc., polysilicon, silicon dioxide, silicon nitride, silicon, and the like.

In this document, the terms "comprises," "comprising," "has", "having", "includes", "including," "contains", "containing" or any other variation thereof, are intended to cover a non-exclusive inclusion, such that a process, method, article, or apparatus that comprises, has, includes, contains a list of elements does not include only those elements but may include other elements not expressly listed or inherent to such process, method, article, or apparatus. The terms "substantially", "essentially", "approximately", "about" or any other version thereof, are defined as being close to as understood by one of ordinary skill in the art, and in one non-limiting embodiment the term is defined to be within 10%, in another embodiment within 5%, in another embodiment within 1% and in another embodiment within 0.5%.

As used herein, the term "configured to", "configured with", "arranged to", "arranged with", "capable of" and any like or similar terms means that referenced circuit elements have an internal physical arrangement such as by virtue of a particular transistor technology used and/or physical coupling and/or connectivity with other circuit elements in an inactive state. This physical arrangement and/or physical coupling and/or connectivity while in the inactive state enables the circuit elements to perform stated functionality while in the active state of receiving and processing various signals at inputs of the circuit elements to generate signals at the output of the circuit elements. A device or structure that is "configured" in a certain way is configured in at least that way, but may also be configured in ways that are not described.

As further used herein, a "node" means any internal or external reference point, connection point, junction, signal line, conductive element, or the like, at which a given signal, logic level, voltage, data pattern, current, or quantity is present. Furthermore, two or more nodes may be realized by one physical element, and two or more signals can be multiplexed, modulated, or otherwise distinguished even though received or output at a common node.

The above description refers to nodes or features being "connected" or "coupled" together. As used here and, unless expressly stated otherwise, "coupled" means that one node or feature is directly or indirectly joined to or is in direct or indirect communication with another node or feature, and not necessarily physically. As used herein, unless expressly stated otherwise, "connected" means that one node or feature is directly joined to or is in direct communication with another node or feature. For example, a switch may be "coupled" to a plurality of nodes, but all of those nodes need not always be "connected" to each other; moreover, the switch may connect different nodes to each other depending on the state of the switch. Furthermore, although the various circuit schematics shown herein depict certain example arrangement of elements, additional intervening elements, devices, features, or components may be present in an actual embodiment, assuming that the functionality of the given circuit is not adversely affected.

In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

What is claimed is:

1. A method performed by a sensor circuit on an integrated circuit chip for sensing on-chip characteristics, the method comprising:
   generating a first voltage using a drive current through a first set of transistors that are operating in saturation mode;
   generating a second voltage using subthreshold leakage current from a second set of transistors that are in subthreshold mode;
   comparing the second voltage to the first voltage to sense an on-chip characteristic.

2. The method of claim 1, wherein comparing the second voltage to the first voltage to sense the on-chip characteristic comprises:
   sensing a voltage difference between the first and second voltages; and
   amplifying the voltage difference to generate a digital output signal that is representative of the sensed on-chip characteristic.

3. The method of claim 2 further comprising providing the digital output signal to an adjustment circuit to compensate for the sensed on-chip characteristic.

4. The method of claim 1, wherein the sensed on-chip characteristic comprises temperature.

5. The method of claim 1, wherein the sensed on-chip characteristic comprises gate length variation.

6. The method of claim 1, wherein generating the first voltage using the drive current through the first set of transistors comprises generating the first voltage using the first set of transistors configured with a first gate length, wherein generating the second voltage using the subthreshold leakage current through the second set of transistors comprises generating the second voltage using the second set of transistors configured with a gate length that is shorter than the gate length of the first set of transistors.

7. The method of claim 1 further comprising generating the second voltage using a current through a third set of transistors that are operating in triode mode or saturation mode.

8. The method of claim 1 further comprising:
   receiving an enable signal and responsively activating the sensor circuit to perform the method;
   receiving a disable signal and responsively deactivating the sensor circuit to prevent performance of the method.

9. The method of claim 8, wherein the enable and disable signals are received into at least one transistor within or coupled to the first set of transistors.

10. The method of claim 8, wherein the enable signal is received into a power-gating transistor, connected to the sensor circuit, to provide a power supply voltage to activate the sensor circuit, and the disable signal is received into the power-gating transistor to remove the power supply voltage to deactivate the sensor circuit.

11. A sensor circuit configured for sensing on-chip characteristics, the sensor circuit comprising:
   a first set of transistors configured to generate a first voltage when operating in saturation mode;
   a second set of transistors coupled to the first set of transistors, wherein the second set of transistors is configured to contribute to the generation of a second voltage, which indicates an on-chip characteristic, when each transistor in the second set is in subthreshold mode;
   a sense amplifier circuit coupled to the first and second sets of transistors and configured to detect a difference between the first and second voltages to sense the on-chip characteristic.

12. The sensor circuit of claim 11, wherein the first set of transistors is configured with at least one transistor characteristic, and wherein the second set of transistors is configured differently from the first set of transistors with regard to the at least one transistor characteristic, which contributes to the generation of the second voltage, and which indicates the on-chip characteristic.

13. The sensor circuit of claim 12, wherein the at least one transistor characteristic comprises gate length, and each transistor in the first set of transistors is configured to have a longer gate length than a gate length of each transistor in the second set of transistors.

14. The sensor circuit of claim 12, wherein the at least one transistor characteristic comprises voltage threshold, and each transistor in the first set of transistors is configured to have a higher voltage threshold than a voltage threshold of each transistor in the second set of transistors.

15. The sensor circuit of claim 13 further comprising a third set of transistors coupled to the first and second sets of transistors, wherein the third set of transistors in configured to contribute to the generation of the second voltage when the transistors in the third set are operating in triode mode or in saturation mode.

16. The sensor circuit of claim 15 further comprising a control input coupled to at least the first set of transistors, wherein the control input is configured to provide an enable signal to enable at least one current path in the sensor circuit and a disable signal to block at least one current path in the sensor circuit.

17. The sensor circuit of claim 16, wherein the control input comprises at least one of:
   an input node coupled to at least one transistor in the first set transistors; or
   a metal-oxide semiconductor field effect transistor coupled to at least one power supply source configured to supply a power supply voltage for the first, second, and third sets of transistors.

18. The sensor circuit of claim 11, wherein the sense amplifier circuit comprises a third set of transistors configured to:
   detect a voltage difference between the first and second voltages; and
   amplify the voltage difference to generate a digital output signal that is representative of the sensed on-chip characteristic.

19. A system comprising:
   an integrated circuit chip;
   a set of sensor circuits disposed on the integrated circuit chip, each sensor circuit comprising:
      a first set of transistors configured with at least one transistor characteristic and configured to generate a first voltage when operating in saturation mode;
      a second set of transistors coupled to the first set of transistors, wherein the second set of transistors is configured to generate a second voltage, which indicates an on-chip characteristic, when a first subset of the second set of transistors is in subthreshold mode and is configured differently from the first set of transistors with regard to the at least one transistor characteristic and when a second subset of the second set of transistors is operating in triode mode or saturation mode;
      a sense amplifier circuit coupled to the first and second sets of transistors, wherein the sense amplifier circuit is configured to sense a voltage difference between the first and second voltages and amplify the voltage difference to generate a digital output signal that is representative of the on-chip characteristic.

20. The system of claim 19, wherein the integrated circuit chip has a first circuit block separated from a second circuit block, and the set of sensor circuits comprises a first sensor circuit disposed on the first circuit block and a second sensor circuit disposed on the second circuit block, wherein the first sensor circuit is configured to sense at least one of temperature or line variation on the first circuit block, and the second sensor circuit is configured to sense at least one of temperature or line variation on the second circuit block.

* * * * *